US012588528B2

(12) United States Patent
Raj et al.

(10) Patent No.: US 12,588,528 B2
(45) Date of Patent: Mar. 24, 2026

(54) PACKAGE BUMPS OF A PACKAGE SUBSTRATE HAVING DIAGONAL PACKAGE BUMPS

(71) Applicant: QUALCOMM Incorporated, San Diego, CA (US)

(72) Inventors: Ashish Raj, Jamshedpur (IN); Feng Zhu, San Diego, CA (US); Shailesh Kumar, Noida (IN)

(73) Assignee: QUALCOMM INCORPORATED, San Diego, CA (US)

( * ) Notice: Subject to any disclaimer, the term of this patent is extended or adjusted under 35 U.S.C. 154(b) by 495 days.

(21) Appl. No.: 18/069,044

(22) Filed: Dec. 20, 2022

(65) Prior Publication Data

US 2024/0203860 A1 Jun. 20, 2024

(51) Int. Cl.
| | |
|---|---|
| *H01L 23/498* | (2006.01) |
| *H01L 21/48* | (2006.01) |
| *H01L 23/00* | (2006.01) |
| *H01L 23/64* | (2006.01) |

(52) U.S. Cl.
CPC ...... *H01L 23/49838* (2013.01); *H01L 21/486* (2013.01); *H01L 23/49816* (2013.01); *H01L 23/645* (2013.01); *H01L 24/16* (2013.01); *H01L 24/17* (2013.01); *H01L 24/32* (2013.01); *H01L 24/73* (2013.01); *H01L 2224/16227* (2013.01); *H01L 2224/17132* (2013.01); *H01L 2224/17133* (2013.01); *H01L 2224/17515* (2013.01); *H01L 2224/32225* (2013.01); *H01L 2224/73204* (2013.01); *H01L 2924/15311* (2013.01)

(58) Field of Classification Search
CPC ............. H01L 23/49838; H01L 21/486; H01L 23/49816; H01L 23/645; H01L 24/16; H01L 24/17
See application file for complete search history.

(56) References Cited

U.S. PATENT DOCUMENTS

| | | | | |
|---|---|---|---|---|
| 2016/0247761 | A1* | 8/2016 | Song | H01F 41/063 |
| 2021/0375738 | A1* | 12/2021 | Ovard | H01L 23/50 |
| 2021/0407948 | A1* | 12/2021 | Kim | H01L 24/14 |
| 2022/0068778 | A1* | 3/2022 | Leslie | H01L 23/50 |
| 2023/0411174 | A1* | 12/2023 | Su | H01L 21/4857 |

* cited by examiner

*Primary Examiner* — Michael Jung
(74) *Attorney, Agent, or Firm* — Muncy, Geissler, Olds & Lowe, P.C.

(57) ABSTRACT

Disclosed are techniques for integrated circuits (ICs). In an aspect, an IC package includes a package substrate having an upper surface, a lower surface, a first side, and a second side perpendicular to the first side. The package substrate includes a metallization structure. The IC package further includes an IC die attached to the upper surface of the package substrate; first package bumps on the lower surface of the package substrate; and second package bumps on the lower surface of the package substrate. The first package bumps are arranged adjacent to one another along a diagonal direction that is diagonal to the package substrate, and the second package bumps are arranged adjacent to one another along the diagonal direction.

20 Claims, 8 Drawing Sheets

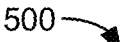

500

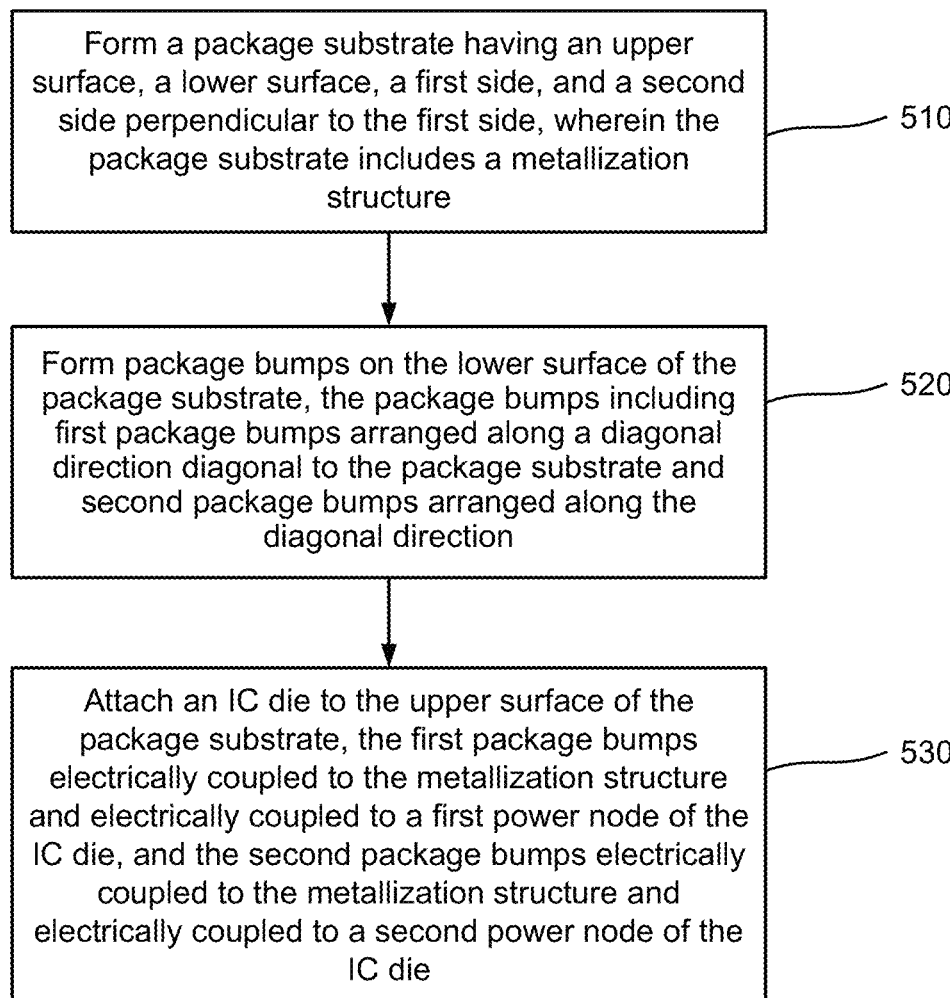

Form a package substrate having an upper surface, a lower surface, a first side, and a second side perpendicular to the first side, wherein the package substrate includes a metallization structure — 510

Form package bumps on the lower surface of the package substrate, the package bumps including first package bumps arranged along a diagonal direction diagonal to the package substrate and second package bumps arranged along the diagonal direction — 520

Attach an IC die to the upper surface of the package substrate, the first package bumps electrically coupled to the metallization structure and electrically coupled to a first power node of the IC die, and the second package bumps electrically coupled to the metallization structure and electrically coupled to a second power node of the IC die — 530

PACKAGE BUMPS OF A PACKAGE SUBSTRATE HAVING DIAGONAL PACKAGE BUMPS

TECHNICAL FIELD

The present disclosure generally relates to integrated circuits (ICs), and more particularly, to package bumps of a package substrate in an IC package.

BACKGROUND

Integrated circuits (ICs) are becoming more prevalent in electronic devices. An IC may be implemented in the form of an IC die (or an IC chip, or simply a die or a chip) that has a set of electronic circuits integrated thereon. In some implementations, an IC die is physically carried and protected by an IC package, where various power and signal nodes of the IC die are electrically coupled to respective package bumps of the IC package via electrical paths formed in a package substrate of the IC package. The power and signal nodes of the die are electrically coupled with a circuit board of the electronic device via the package bumps. The voltage drops between the IC die and the package bumps caused by the power or signal currents along the electrical paths interacting with at least the resistances of the electrical paths (also known as IR drop) may impact the performance of the IC die.

Accordingly, there is a need for improved IC package designs that reduce the IR drop associated with the IC packages.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an integrated circuit (IC) package includes a package substrate having an upper surface, a lower surface, a first side, and a second side perpendicular to the first side, wherein the package substrate includes a metallization structure; an IC die attached to the upper surface of the package substrate; first package bumps on the lower surface of the package substrate, the first package bumps electrically coupled to the metallization structure and electrically coupled to a first power node of the IC die; and second package bumps on the lower surface of the package substrate, the second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged adjacent to one another along the diagonal direction.

In an aspect, a method of manufacturing an integrated circuit (IC) package includes forming a package substrate having an upper surface, a lower surface, a first side, and a second side perpendicular to the first side, wherein the package substrate includes a metallization structure; forming package bumps on the lower surface of the package substrate; and attaching an IC die to the upper surface of the package substrate wherein the package bumps comprising: first package bumps electrically coupled to the metallization structure and electrically coupled to a first power node of the IC die; and second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged adjacent to one another along the diagonal direction.

In an aspect, a package substrate having an upper surface includes a plurality of die-side bump pads on the upper surface of the package substrate for receiving an integrated circuit (IC) die, the plurality of die-side bump pads comprising: first die-side bump pads corresponding to a first power node of the IC die, and second die-side bump pads corresponding to a second power node of the IC die; a metallization structure; a plurality of package bump pads on the lower surface of the package substrate for receiving package bumps, the plurality of package bump pads comprising: first package bump pads electrically coupled to the metallization structure and electrically coupled to the first die-side bump pads; and second package bump pads for a second supply voltage, the second package bump pads electrically coupled to the metallization structure and electrically coupled to the second die-side bump pads, wherein the package substrate includes a first side and a second side perpendicular to the first side, wherein the first package bump pads are arranged adjacent to one another along a diagonal direction that is diagonal to the package substrate, and wherein the second package bump pads are arranged adjacent to one another along the diagonal direction.

In an aspect, an apparatus includes an integrated circuit (IC) package comprising: a package substrate having an upper surface, a lower surface, a first side, and a second side perpendicular to the first side, wherein the package substrate includes a metallization structure; an IC die attached to the upper surface of the package substrate; first package bumps on the lower surface of the package substrate, the first package bumps electrically coupled to the metallization structure and electrically coupled to a first power node of the IC die; and second package bumps on the lower surface of the package substrate, the second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged adjacent to one another along the diagonal direction.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

FIG. 5 illustrates a method for manufacturing an IC package, according to aspects of the disclosure.

DETAILED DESCRIPTION

Figure 1A:
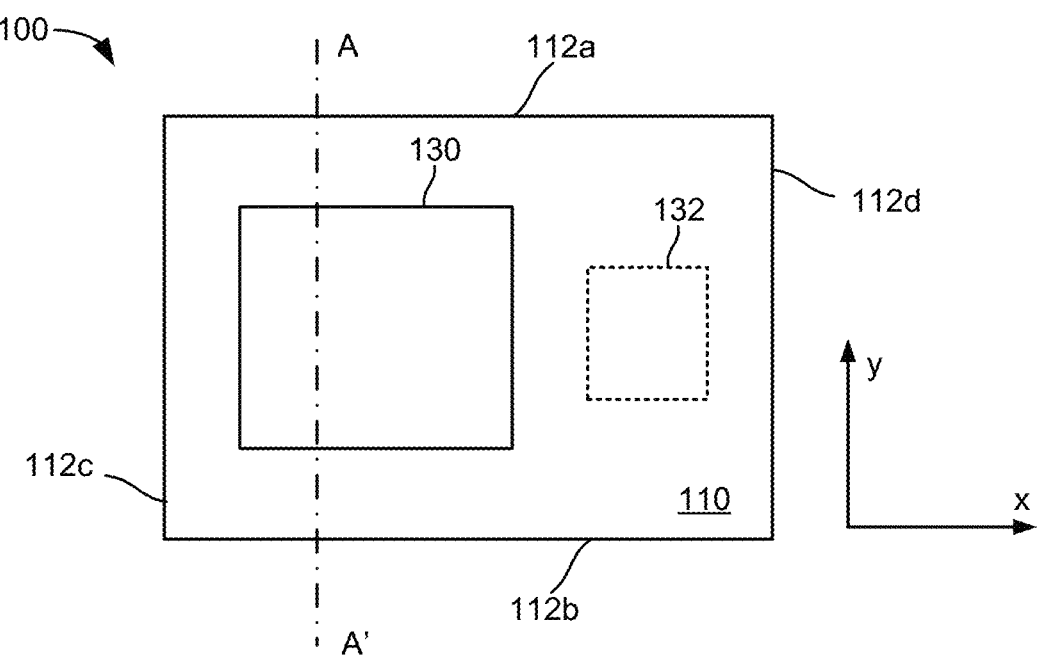
FIG. 1A is a top view of an IC package, according to aspects of the disclosure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

In some aspects, an IC package may include die-side bumps connecting power nodes and signal nodes of an IC die with a package substrate of the IC package, and may include package bumps electrically coupled to at least a portion of the power nodes and signal nodes of the IC die via conductive paths in the package substrate. The package substrate may include an upper surface, a lower surface, a first side parallel to a first direction and a second side parallel to a second direction perpendicular to the first direction. In some aspects, a set of package bumps that are electrically coupled to a power node of the IC die for a particular supply voltage may be arranged along a diagonal direction that is diagonal to the package substrate. In this disclosure, the expression of "diagonal to the package substrate" and "diagonal direction" are not used to strictly refer to a direction defined by a diagonal line of the upper surface or the lower surface of the package substrate. Rather, in this disclosure, the expression of "diagonal to the package substrate" and "diagonal direction" correspond to a tilted direction different from the first direction and the second direction, and the tilted direction is closer to a direction defined by a diagonal line of the upper surface or the lower surface of the package substrate than the first direction and the second direction. In some aspects, the diagonal direction is at an angle of 45 degrees or 135 degrees relative to the first side (e.g., relative to the first direction). In some aspects, because the die-side bumps may also be arranged in a tilted-line pattern at an angle of 45 degrees or 135 degrees relative to the first side, arranging the package bumps for the same supply voltage in a tilted-line pattern along the diagonal direction may improve the corresponding IR drop based on the improved routing of the conductive paths within the package substrate as a result of matched bump pattern designs of the die-side bumps and the package bumps.

FIG. 1A is a top view of an IC package 100, according to aspects of the disclosure. The IC package 100 includes a package substrate 110 and an IC die 130 mounted on the package substrate 110. In some other examples, the IC package 100 may further include another IC die 132 and/or other surface-mount electrical components mounted on the package substrate 110.

As shown in FIG. 1A, the package substrate 110 has a rectangular shape and includes four sides corresponding to side surfaces 112a, 112b, 112c, and 112d. The sides corresponding to side surfaces 112a and 112b are parallel to a first direction (e.g., the x-direction) and the sides corresponding to side surfaces 112c and 112d are parallel to a second direction (e.g., the y-direction) that is perpendicular to the first direction. In some aspects, the package substrate 110 may have a square shape, a rounded rectangular or square shape, or the like.

Figure 1B:
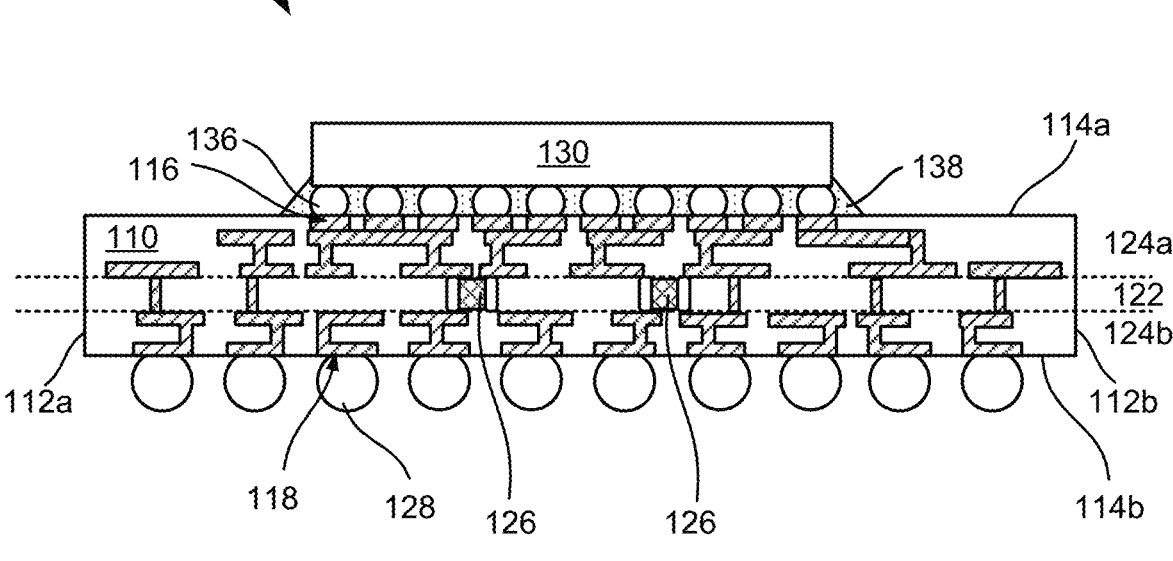
FIG. 1B is a cross-sectional view of the IC package in FIG. 1A, along the cutting plane A-A', according to aspects of the disclosure.

FIG. 1B is a cross-sectional view of the IC package 100 in FIG. 1A, along the cutting plane A-A', according to aspects of the disclosure. The package substrate 110 of the IC package 100 has an upper surface 114a and a lower surface 114b that are parallel to the first direction and the second direction. The package substrate 110 include a core layer 122, a first metallization structure 124a, and a second metallization structure 124b. The first metallization structure 124a and the second metallization structure 124b may include conductive paths formed by layers of conductive lines and corresponding vias. In some aspects, the core layer 122 may include one or more passive electronic components 126 and one or more vias connecting the conductive paths formed in the first metallization structure 124a and the second metallization structure 124b.

The IC package 100 may include die-side bumps 136 connecting power nodes and signal nodes of the IC die 130 with the conductive paths and corresponding die-side bump pads 116 of the package substrate 110. The IC package 100 may include package bumps 128 on the lower surface 114b of the package substrate 110 electrically coupled to at least a portion of the power nodes and signal nodes of the IC die 130 via the conductive paths and corresponding package bump pads 118 formed in the package substrate 110. Moreover, the IC package 100 may include a underfill structure 138 that fills the spacing between the IC die 130, package substrate 110, and the die-side bumps 136.

In some aspects, for each one of the die-side bumps 136, a corresponding die-side bump pad 116 may be formed on the upper surface 114a and as part of the first metallization structure 124a. In some aspects, for each one of the package bumps 128, a corresponding package bump pad 118 may be formed on the lower surface 114b and as part of the second metallization structure 124b. As the bumps and corresponding bump pads are configured to be electrically connected and are configured to have a matched pattern, in this disclosure, the bumps and the corresponding bump pads may have the same pattern and physically and electrically connected in the finished IC package.

In some aspects, the IC die 130 may be a semiconductor IC and include complementary metal-oxide-semiconductor (CMOS) transistors, bipolar junction transistors (BJTs), microelectromechanical systems (MEMS), and/or other active or passive electronic components. In some aspects, the IC die 130 may be manufactured by a process based on a silicon substrate, a III-V substrate such as a gallium arsenide (GaAs) substrate, or any suitable semiconductor substrate. In some aspects, the IC die 130 is a central processing unit (CPU), a graphic processing unit (GPU), a memory, or a system on a chip (SoC).

In some aspects, the package substrate 110 may be formed based on a resin substrate, a ceramic substrate, or a semiconductor substrate. In some aspects, the passive electronic components 126 may include a capacitive component, an inductive component, or a combination thereof. In some aspects, the package substrate 110 shown in FIG. 1B is also referred to as an embedded passive substrate (EPS), for including the passive electronic components 126 therein.

In some aspects, the capacitive component as one of the passive electronic components may have a first terminal electrically coupled to a package bump for a first supply voltage (e.g., VCC or VDD for the IC die 130) and a second terminal electrically coupled to another package bump for a second supply voltage (e.g., VSS or Ground for the IC die 130). Such capacitive component may be used as a low pass filter to stabilize the voltage levels of the power supply network of the IC package. In some aspects, the inductive component as one of the passive electronic components may have a first terminal electrically coupled to a package bump for a supply voltage and a second terminal electrically coupled to a power node for the supply voltage of the IC die. Such inductive component may be used as a high-frequency choke to stabilize the voltage levels of the power supply network of the IC package.

Figure 2A:
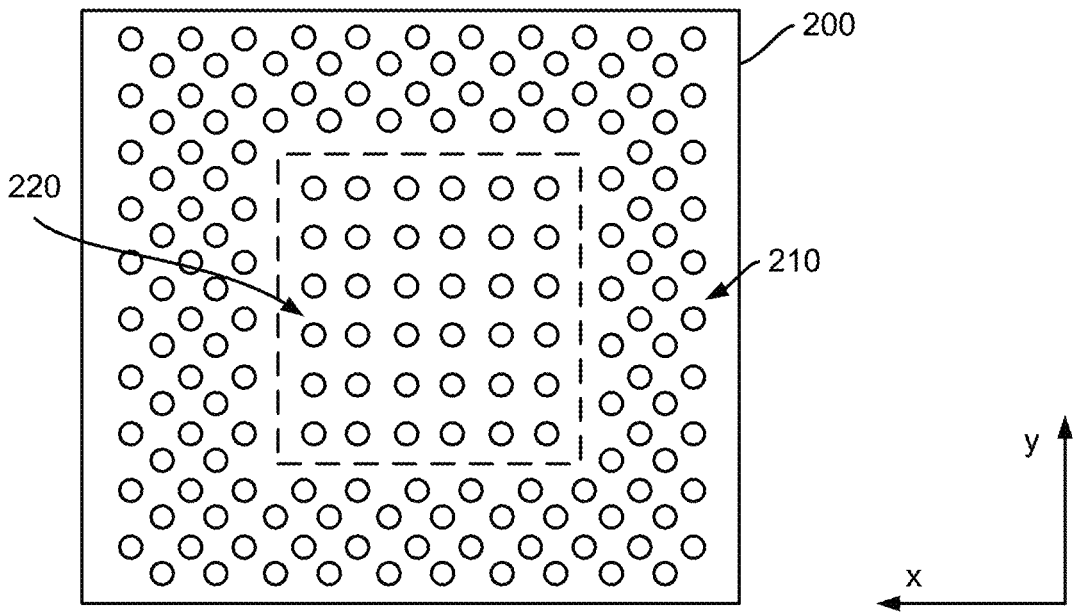
FIG. 2A is a bottom view of an IC die, according to aspects of the disclosure.

FIG. 2A is a bottom view of an IC die 200, according to aspects of the disclosure. In some aspects, the IC die 200 may correspond to the IC die 130 in the IC package 100. The first direction (e.g., the x-direction) and the second direction (e.g., the y-direction) as shown in FIG. 1A are also depicted in FIG. 2A for clarity regarding the spatial relationship between the IC die 200 in the IC package 100.

The IC die 200 may include a set of die-side bumps in zone 210 that are for signals and may be optionally for power supply voltages. The IC die 200 may include another set of die-side bumps in zone 220 that are for power supply voltages. The arrangement of zones 210 and 220 is depicted as a non-limiting example.

Figure 2B:
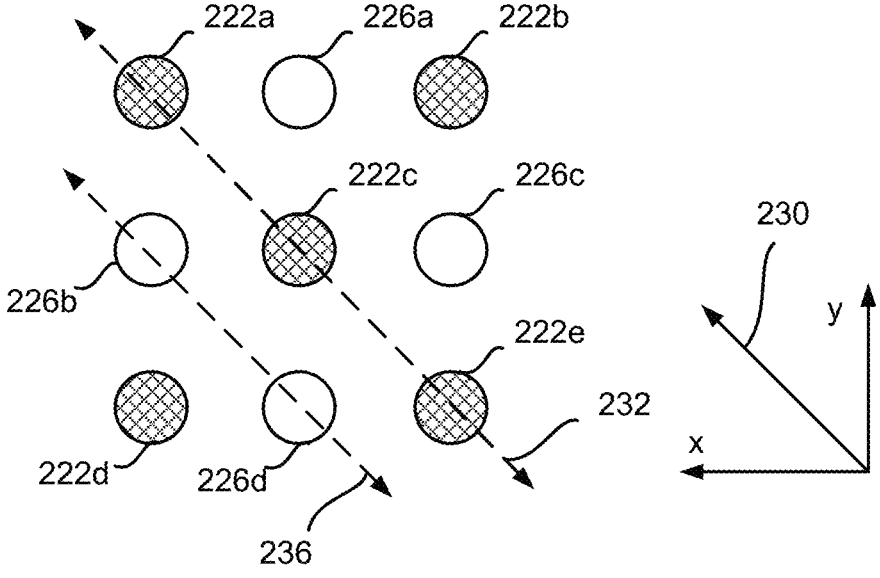
FIG. 2B illustrates a bump pattern of a portion of the die-side bumps of the IC die, according to aspects of the disclosure.

FIG. 2B illustrates a bump pattern of a portion of the die-side bumps 222a-222e and 226a-226d of the IC die 200, according to aspects of the disclosure. In some aspects, the die-side bumps 222a-222e and 226a-226d may correspond to a portion of the die-side bumps 136 in FIG. 1 and may correspond to a portion of the die-side bumps in zone 220 in FIG. 2A. The first direction (e.g., the x-direction) and the second direction (e.g., the y-direction) as shown in FIG. 1A are also depicted in FIG. 2B for clarity regarding the spatial relationship between the die-side bumps 222a-222e and 226a-226d in the IC package 100. The round shape of the die-side bumps 222a-222e and 226a-226d is depicted only to show the positions of the die-side bumps. Depending on the material and manufacturing technology, the die-side bumps may have a round-like shape after a reflow process and may not maintain a round-like shape after the die-side bumps are bonded to the corresponding die-side bump pads on the upper surface of the IC package.

In some aspects, the die-side bumps 222a-222e and 226a-226d of the IC die 200 represent a portion of the die-side bumps in zone 220 for supply voltages. In some aspects, the die-side bumps 222a-222e may be configured for a first supply voltage (e.g., VCC or VDD for the IC die 200) and electrically coupled to a first power node of the IC die 200 for the first supply voltage. In some aspects, the die-side bumps 226a-226d may be configured for a second supply voltage (e.g., VSS or Ground for the IC die 200) and electrically coupled to a second power node of the IC die 200 for the second supply voltage.

In some aspects, the die-side bumps for the supply voltages may be arranged into lines of die-side bumps, and the die-side bumps of each line may be arranged adjacent to one another along a direction 230 different from the first direction (e.g., the x-direction) and the second direction (e.g., the y-direction). For example, the die-side bumps 222a, 222c, and 222c may be arranged adjacent to one another based on a reference line 232 alone the direction 230, and the die-side bumps 226b and 226d may be arranged adjacent to one another based on a reference line 236 alone the direction 230. In some aspects, the first direction and the direction 230 may define an angle of 45 degrees or 135 degrees.

Figure 3A:
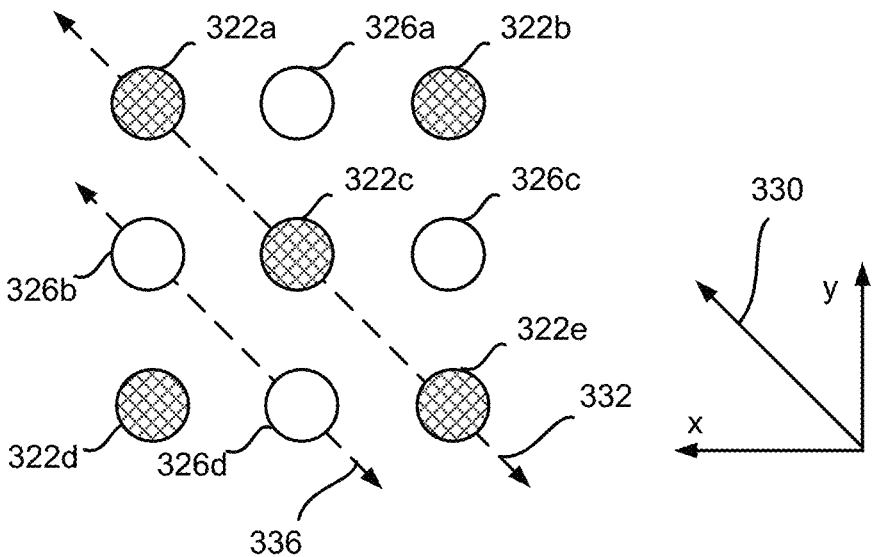
FIG. 3A illustrates a bump pattern of a portion of package bumps of an IC package, according to aspects of the disclosure.

FIG. 3A illustrates a bump pattern of a portion of package bumps 322a-322e and 326a-326d of an IC package (such as the IC package 100), according to aspects of the disclosure. In some aspects, the package bumps 322a-322c and 326a-326d may correspond to a portion of the package bumps 128 in FIG. 1. The first direction (e.g., the x-direction) and the second direction (e.g., the y-direction) as shown in FIG. 1A are also depicted in FIG. 3A for clarity regarding the spatial relationship between package bumps 322a-322e and 326a-326d in the IC package 100. The round shape of the package bumps 322a-322e and 326a-326d is depicted only to show the positions of the package bumps. Depending on the material and manufacturing technology, the package bumps may have a round-like shape after a reflow process and may not maintain a round-like shape after the package bumps are bonded to a printed circuit board of an electronic device (not shown).

In some aspects, the package bumps 322a-322e may be configured for a first supply voltage (e.g., VCC or VDD for the IC die 130 or 200) and electrically coupled to a first power node of the IC die 130 or 200. In some aspects, the package bumps 326a-326d may be configured for a second supply voltage (e.g., VSS or Ground for the IC die 130 or 200) and electrically coupled to a second power node of the IC die 130 or 200 for the second supply voltage.

In some aspects, the package bumps for the supply voltages may be arranged into lines of package bumps, and the package bumps of each line may be for a same supply voltage and arranged adjacent to one another along a direction 330 different from the first direction (e.g., the x-direction) and the second direction (e.g., the y-direction). In some aspects, the direction 330 may be referred to as a diagonal direction in this disclosure, as the direction 330 may be generally (not strictly) parallel to a diagonal line of the package substrate 110. For example, the package bumps 322a, 322c, and 322e may be arranged adjacent to one another based on a reference line 332 along the direction 330, and the package bumps 326b and 326d may be arranged adjacent to one another based on a reference line 336 along the direction 330. In some aspects, the direction 330 may be at an angle of 45 degrees or 135 degrees relative to a first side (e.g., corresponding to the side surface 112b) or the first direction (e.g., the x-direction). For example, the first direction and the direction 330 may define an angle of 45 degrees or 135 degrees. In some aspects, the direction 330 may be arranged to match the direction 230 for the IC die as shown in FIG. 2.

Figure 3B:
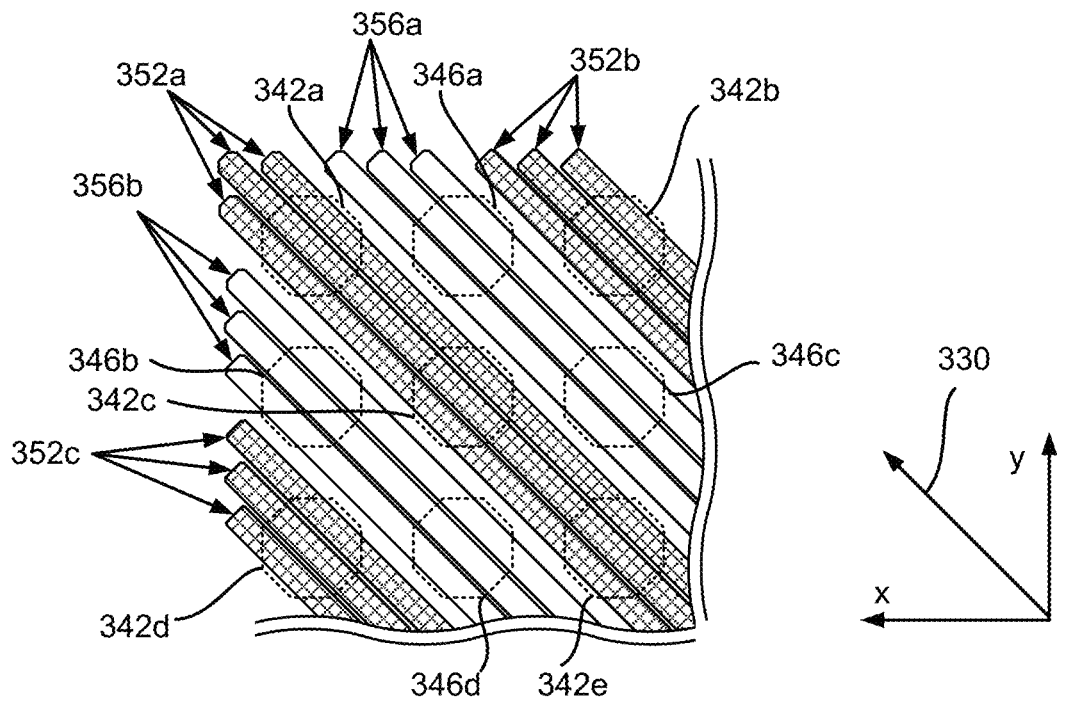
FIG. 3B illustrates an example set of package bump pads and conductive lines for electrically coupling package bumps arranged based on the bump pattern of FIG. 3A, according to aspects of the disclosure.

FIG. 3B illustrates an example set of package bump pads 342a-342e and 346a-346d and conductive lines 352a-352c and 356a-356b for electrically coupling package bumps (e.g., the package bumps 322a-322e and 326a-326d) arranged based on the bump pattern of FIG. 3A, according to aspects of the disclosure. In some aspects, the package bump pads 342a-342e and 346a-346d and conductive lines 352a-352c and 356a-356b may be formed in a metallization structure of the package substrate, such as the second metallization structure 124b of the package substrate 110. In some aspects, the package bump pads 342a-342e and 346a-346d may be formed on the lower surface 114b of the package substrate 110 by a conductive layer of the second metallization structure 124b. In some aspects, as shown in FIG. 3B, the conductive lines for a particular supply voltage may form a tilted-line pattern.

In some aspects, the package bumps 322a-322e and 326a-326d are to be formed on or bonded to the package bump pads 342a-342e and 346a-346d, respectively. Similar to the bump pattern as illustrated in FIG. 3A, package bump pads 342a-342e are for the first supply voltage, electrically coupled to the metallization structure and electrically coupled to the die-side bump pads on the upper surface 114a for the first supply voltage; and package bump pads 346a-346d are for the second supply voltage, electrically coupled to the metallization structure and electrically coupled to the die-side bump pads on the upper surface 114a for the second supply voltage.

In some aspects, the package bump pads for the supply voltages may be arranged into lines of package bump pads, and the package bump pads of each line may be arranged adjacent to one another along the direction 330. For example, the package bump pads 342a, 342c, and 342e may be arranged adjacent to one another along the direction 330, and the package bump pads 346a and 346d may be arranged adjacent to one another along the direction 330.

In some aspects, the second metallization structure 124b may include conductive lines 352a, 352b, 352c. 356a, and 356b for connecting the package bump pads to other parts of the IC package and IC die. The conductive lines 352a, 352b, 352c, 356a, and 356b may extend along the direction 330 that is different from the first direction (e.g., the x-direction) and the second direction (e.g., the y-direction).

For example, the second metallization structure 124b may include conductive lines 352a extending along the direction 330 and electrically coupled to the package bump pads 342a, 342c, and 342c, which would be further electrically coupled to package bumps 322a, 322c, and 322e when these bumps are attached to the package bump pads 342a. 342c, and 342c. Also, the second metallization structure 124b may include conductive lines 356b extending along the direction 330 and electrically coupled to the package bump pads 346b and 346d, which would be further electrically coupled to package bumps 326b and 326d when these bumps are attached to the package bump pads 346b and 346d.

In some aspects, the conductive lines 352a, 352b, 352c, and 356a, and 356b may be at a same conductive layer of the metallization structure (e.g., the second metallization structure 124b). In some aspects, the conductive lines 352a, 352b, 352c, and 356a, and 356b may be at one conductive layer of the metallization structure, and the package bump pads 342a-342e and 346a-346d may be at another conductive layer of the metallization structure.

Figure 3C:
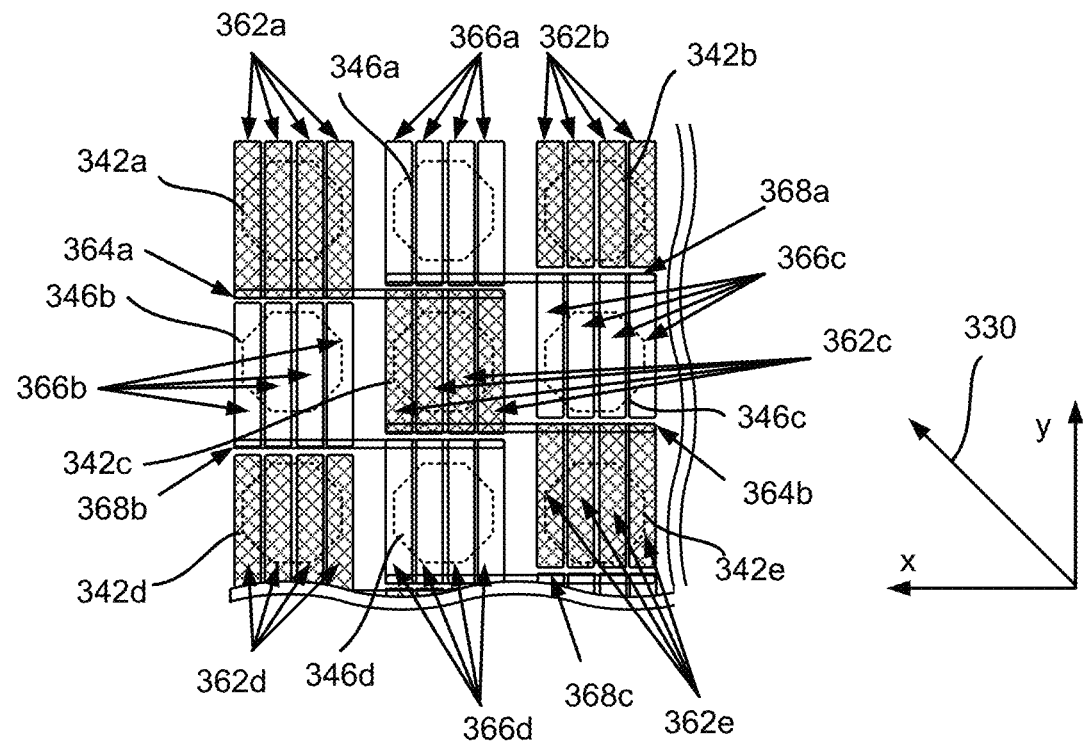
FIG. 3C illustrates another example set of package bump pads and conductive lines for electrically coupling package bumps arranged based on the bump pattern of FIG. 3A, according to aspects of the disclosure.

FIG. 3C illustrates another example set of package bump pads 342a-342c and 346a-346d and conductive lines 362a-362c, 364a-364b, 366a-366d, and 368a-368c for electrically coupling package bumps (e.g., the package bumps 322a-322e and 326a-326d) arranged based on the bump pattern of FIG. 3A, according to aspects of the disclosure. In some aspects, the package bump pads 342a-342c and 346a-346d and conductive lines 362a-362c. 364a-364b, 366a-366d, and 368a-368c may be formed in a metallization structure of the package substrate, such as the second metallization structure 124b of the package substrate 110. In some aspects, the package bump pads 342a-342c and 346a-346d correspond to the package bump pads 342a-342c and 346a-346d illustrated with reference to FIG. 3B, and detailed description thereof is not repeated. In some aspects, as shown in FIG. 3C, the conductive lines for a particular supply voltage may form a staircase pattern.

In some aspects, the second metallization structure 124*b* may include conductive lines 362*a*-362*c*, 364*a*-364*b*, 366*a*-366*d*, and 368*a*-368*c* for connecting the package bump pads to other parts of the IC package and IC die. The conductive lines 362*a*-362*e* and 366*a*-366*d* are sets of conductive lines that are electrically coupled to the package bump pads 342*a*-342*c* and 346*a*-346*d*, respectively. The conductive lines 364*a*-364*b* and 368*a*-368*c* are electrically coupled to adjacent sets of conductive lines 362*a*-362*e* and 366*a*-366*d* for a same supply voltage. In this example, the conductive lines 362*a*-362*e* and 366*a*-366*d* may extend along the second direction (e.g., the y-direction), and the conductive lines 362*a*-362*e* and 366*a*-366*d* may extend along the first direction (e.g., the x-direction).

For example, sets of conductive lines 362*a*, 362*c*, and 362*e* may extend along the second direction and be electrically coupled to the package bump pads 342*a*, 342*c*, and 342*c*, respectively. The sets of conductive lines 362*a*, 362*c*, and 362*e* would be further electrically coupled to package bumps 322*a*. 322*c*, and 322*c*, respectively, when these bumps are attached to the package bump pads 342*a*, 342*c*, and 342*c*. Sets of conductive lines 364*a* and 364*b* may extend along the first direction and be electrically coupled to adjacent conductive lines of the sets of conductive lines, respectively (e.g., connecting conductive lines 362*a* and 362*c* by conductive line 364*a* and connecting conductive lines 362*c* and 362*e* by conductive line 364*b*). Also, sets of conductive lines 366*b* and 366*d* may extend along the second direction and be electrically coupled to the package bump pads 346*b* and 346*d*, respectively. The sets of conductive lines 366*b* and 366*d* would be further electrically coupled to package bumps 326*b* and 326*d*, respectively, when these bumps are attached to the package bump pads 346*b* and 346*d*. Sets of conductive lines 368*b* and 368*c* may extend along the first direction and be electrically coupled to adjacent conductive lines of the sets of conductive lines, respectively (e.g., connecting conductive lines 366*b* and 366*d* by conductive line 368*b* and connecting conductive lines 366*d* and another set of conductive lines not fully shown in FIG. 3C by conductive line 368*c*).

In some aspects, the sets of conductive lines 362*a*-362*e* and 366*a*-366*d* may be at a same conductive layer of the metallization structure (e.g., the second metallization structure 124*b*), and the sets of conductive lines 364*a*-364*b* and 368*a*-368*c* may be at another conductive layer of the metallization structure. In some aspects, the package bump pads 342*a*-342*c* and 346*a*-346*d* may be at yet another conductive layer of the metallization structure.

Figure 4A:
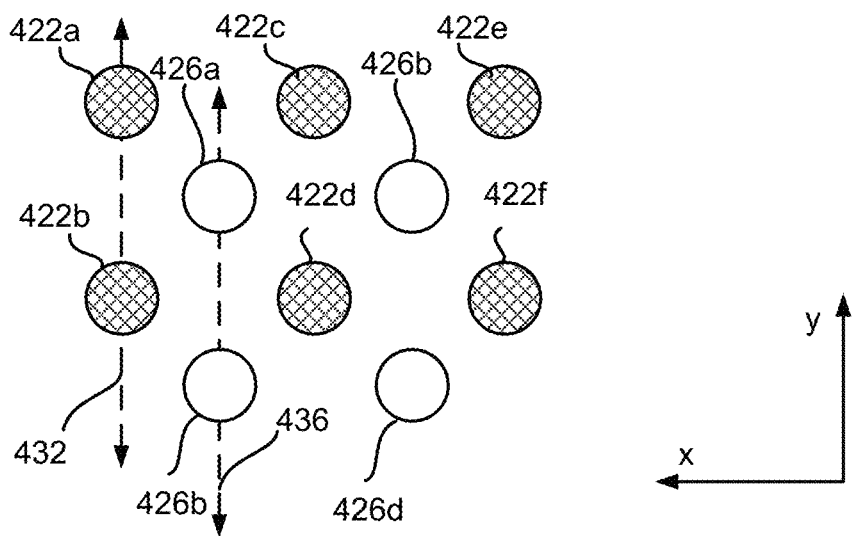
FIG. 4A illustrates another bump pattern of a portion of package bumps of an IC package, according to related art.

FIG. 4A illustrates another bump pattern of a portion of package bumps 422*a*-422*f* and 426*a*-426*d* of an IC package (such as the IC package 100), according to related art. FIG. 4A shows a bump pattern design different from the bump pattern design as shown in FIG. 3A. In some aspects, the package bumps 422*a*-422*f* and 426*a*-426*d* may correspond to a portion of the package bumps 128 in FIG. 1. The first direction (e.g., the x-direction) and the second direction (e.g., the y-direction) as shown in FIG. 1A are also depicted in FIG. 4A for clarity regarding the spatial relationship between package bumps 422*a*-422*f* and 426*a*-426*d* in the IC package 100.

In some aspects, the package bumps 422*a*-422*f* may be configured for a first supply voltage (e.g., VCC or VDD for the IC package 100 or the IC die 200). In some aspects, the package bumps 426*a*-426*d* may be configured for a second supply voltage (e.g., VSS or Ground for the IC package 100 or the IC die 200). In some aspects, the package bumps for the supply voltages may be arranged into lines of package bumps, and the package bumps of each line may be for a same supply voltage and arranged adjacent to one another along the second direction (e.g., the y-direction). For example, the package bumps 422*a* and 422*b* may be arranged adjacent to one another based on a reference line 432 along the y-direction, and the package bumps 426*a* and 426*b* may be arranged adjacent to one another based on a reference line 436 along the y-direction.

Figure 4B:
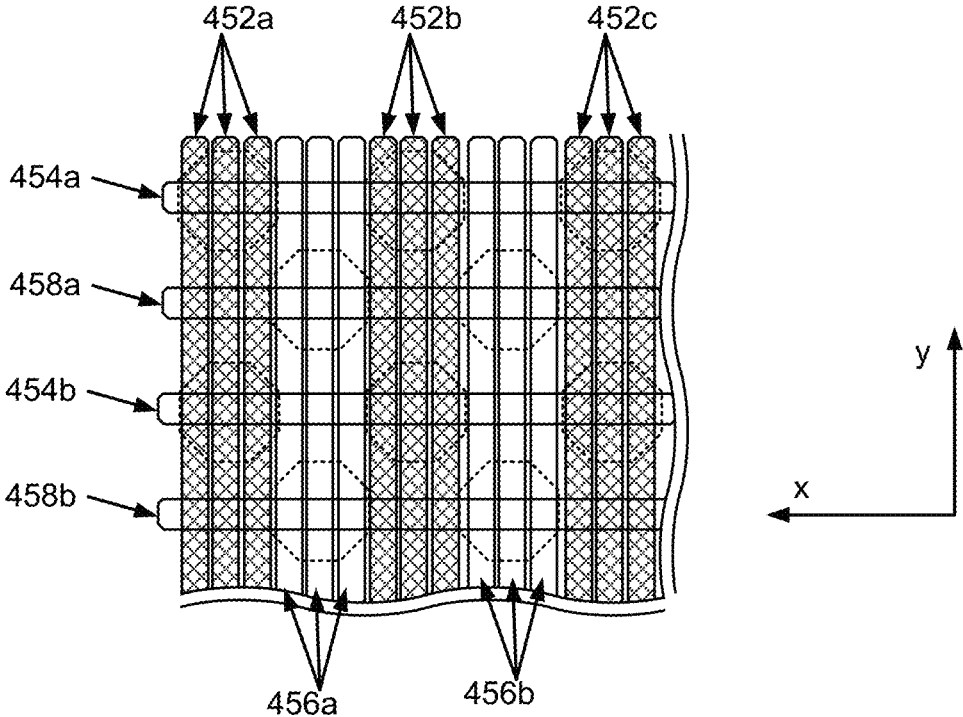
FIG. 4B illustrates an example set of package bump pads and conductive lines for electrically coupling package bumps arranged based on the bump pattern of FIG. 4A, according to related art.

FIG. 4B illustrates an example set of package bump pads (depicted as dashed-octagons and not labeled) and conductive lines 452*a*-452*c*, 454*a*-454*b*, 456*a*-456*b*, and 458*a*-458*b* for electrically coupling package bumps (e.g., the package bumps 422*a*-422*f* and 426*a*-426*d*) arranged based on the bump pattern of FIG. 4A, according to related art. In some aspects, the package bump pads and conductive lines 452*a*-452*c*, 454*a*-454*b*, 456*a*-456*b*, and 458*a*-458*b* may be formed in a metallization structure of the package substrate, such as the second metallization structure 124*b* of the package substrate 110.

In some aspects, the package bump pads for the supply voltages may be arranged into lines of package bump pads, and the package bump pads of each line may be arranged adjacent to one another along the y-direction. In some aspects, the second metallization structure 124*b* may include conductive lines 452*a*-452*c*. 454*a*-454*b*, 456*a*-456*b*, and 458*a*-458*b* for connecting the package bump pads to other parts of the IC package and IC die. The conductive lines 452*a*-452*c* and 456*a*-456*b* may extend along the y-direction. The conductive lines 454*a* and 454*b* may extend along the x-direction to electrically connecting conductive lines 452*a*-452*c*, and the conductive lines 458*a* and 458*b* may extend along the x-direction to electrically connecting conductive lines 456*a*-456*b*.

In some aspects, a package substrate implemented based on FIGS. 3A-3C and a package substrate implemented based on FIGS. 4A-4B may have substantially the same level of IR drop (e.g., less than 0.25% difference) measurable between the package bumps for a same supply voltage. In some aspects, an IC package implemented based on the IC die in FIG. 2A-2B and a bump pattern of FIGS. 3A-3C may have an improved IR drop performance (e.g., at least 1.0% improvement) measurable between the die-side bump pads and the corresponding package bumps, compared to an IC package implemented based on the IC die in FIG. 2A-2B and a bump pattern of FIGS. 4A-4B. In some aspects, such improvement may be based on the improved routing within the package substrate as a result of the matched bump pattern designs of the die-side bumps and the package bumps (e.g., with tilted-line patterns).

For example, in one testing case, the IR drop between package bumps based on FIGS. 4A-4B (Sample 1), the IR drop between package bumps based on FIGS. 3A-3B (Sample 2), and the IR drop between package bumps based on FIGS. 4A and 4C (Sample 3) may be as presented in Table I below.

TABLE I

|  | Max. IR Drop (%) | Min. IR Drop (%) | Mean IR Drop (%) |
|---|---|---|---|
| Sample 1 | 10.76 | 0.04 | 1.29 |
| Sample 2 | 10.99 | 0.04 | 1.34 |
| Sample 3 | 10.83 | 0.08 | 1.44 |

Also, in the same testing case, the IR drop between die-side bumps and corresponding package bumps based on FIGS. 4A-4B (Sample 1) and the IR drop between die-side bumps and corresponding package bumps based on FIGS. 3A-3B (Sample 2) may be as presented in Table II below.

TABLE II

| | Bump Pattern Tilt Angle | | Die-to-Package | | System PDN |
|---|---|---|---|---|---|
| | Die Side | Package | DC R (Ω) | AC L (pH) | IR Drop |
| Sample 1 | 90 (y-dir.) | 45 | 1.3 | 10.5 | 13.60% |
| Sample 2 | 45 | 45 | 0.8 | 7.5 | 12.60% |

In Table II, "DC R" represents direct current resistance in ohms, "AC L" represents alternate current inductance in pico-Henrys, and "System PDN" represents power delivery network performance at a system level, which is measurable in Table II based on the IR drop between the die-side bumps to the corresponding package bumps.

In some aspects, for an IC package, an 1% improvement in IR drop for the power nodes or supply voltages may significantly improve the performance of the IC package, including less power consumption, better heat dissipation, more margins for power budget management, and less constrains to operating the IC die at its full potential performance.

FIG. 5 illustrates a method 500 for manufacturing an IC package (such as the IC package 100), according to aspects of the disclosure.

At operation 510, a package substrate, such as the package substrate 110, is formed.

In some aspects, package substrate has an upper surface, a lower surface, a first side parallel to a first direction (e.g., the x-direction), and a second side parallel to a second direction (e.g., the y-direction) and perpendicular to the first side. Moreover, the package substrate includes at least one metallization structure, such as the metallization structure 124a and the metallization structure 124b.

At operation 520, package bumps are formed on the lower surface of the package substrate, the package bumps including first package bumps for a first supply voltage and second package bumps for a second supply voltage. In some aspects, the first package bumps are arranged along a diagonal direction that is diagonal to the package substrate and different from the first direction and the second direction, and the second package bumps are arranged along the diagonal direction. For example, the first package bumps for the first supply voltage and the second package bumps for the second supply voltage may be arranged based on the example shown in FIG. 3A. In some aspects, the diagonal direction may be at an angle of 45 degrees or 135 degrees relative to the first side (e.g., corresponding to the side surface 112b) or the first direction (e.g., the x-direction). For example, the first direction and the diagonal direction define an angle of 45 degrees or 135 degrees.

At operation 530, an IC die (such as the IC die 130 or 200) is attached to the upper surface of the package substrate.

In some aspects, the forming the package substrate at operation 510 may further include forming first conductive lines in the metallization structure extending along the diagonal direction and electrically coupled to the first package bumps via corresponding package bump pads; and forming second conductive lines in the metallization structure extending along the diagonal direction and electrically coupled to the second package bumps via corresponding package bump pads. In some aspects, the first conductive lines and the second conductive lines are at a same conductive layer of the metallization structure.

In some aspects, the forming the package substrate at operation 510 may further include forming sets of third conductive lines in the metallization structure extending along the second direction and electrically coupled to the first package bumps, respectively, via corresponding package bump pads; forming sets of fourth conductive lines in the metallization structure extending along the first direction and electrically coupled to adjacent conductive lines of the sets of third conductive lines, respectively; forming sets of fifth conductive lines in the metallization structure extending along the second direction and electrically coupled to the second package bumps, respectively, via corresponding package bump pads; and forming sets of sixth conductive lines in the metallization structure extending along the first direction and electrically coupled to adjacent conductive lines of the sets of fifth conductive lines, respectively. In some aspects, the sets of third conductive lines and the sets of fifth conductive lines are at one conductive layer of the metallization structure, and the sets of fourth conductive lines and the sets of sixth conductive lines are at another conductive layer of the metallization structure.

In some aspects, the forming the package substrate at operation 510 may further include forming a passive electronic component electrically coupled to at least one of the first package bumps or at least one of the second package bumps via the metallization structure. In one example, the passive electronic component may be a capacitive component having a first terminal electrically coupled to one of the first package bumps and a second terminal electrically coupled to one of the second package bumps. In one example, the passive electronic component may be an inductive component having a first terminal electrically coupled to one of the first package bumps and a second terminal electrically coupled to the first power node of the IC die.

Figure 6:
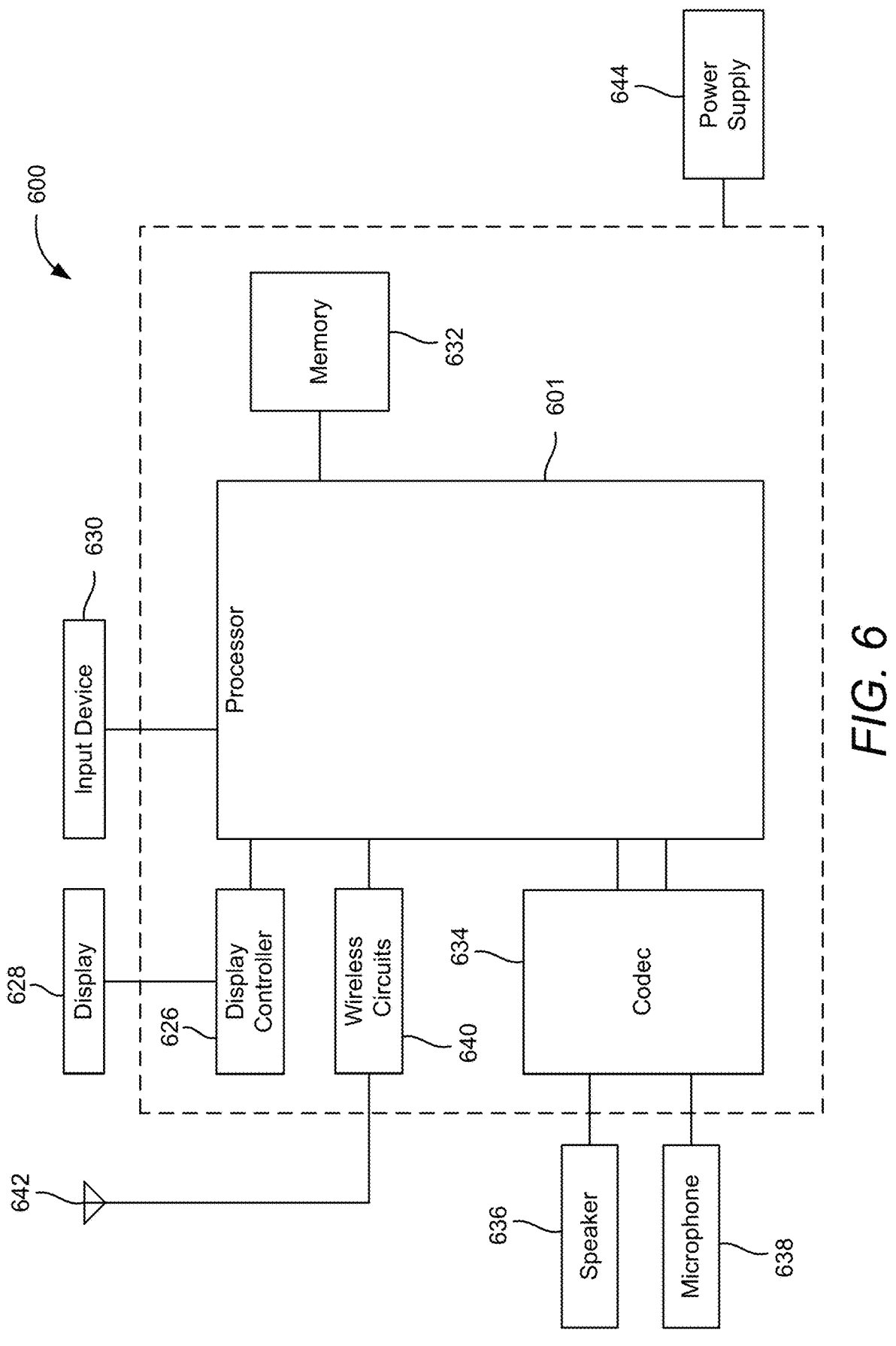
FIG. 6 illustrates a mobile device example, according to aspects of the disclosure.

FIG. 6 illustrates a mobile device 600, according to aspects of the disclosure. In some aspects, the mobile device 600 may be implemented by including one or more IC packages based on the IC package described in this disclosure.

In some aspects, mobile device 600 may be configured as a wireless communication device. As shown, mobile device 600 includes processor 601. Processor 601 may be communicatively coupled to memory 632 over a link, which may be a die-to-die or chip-to-chip link. Mobile device 600 also includes display 628 and display controller 626, with display controller 626 coupled to processor 601 and to display 628. The mobile device 600 may include input device 630 (e.g., physical, or virtual keyboard), power supply 644 (e.g., battery), speaker 636, microphone 638, and wireless antenna 642. In some aspects, the power supply 644 may directly or indirectly provide the supply voltage for operating some or all of the components of the mobile device 600.

In some aspects, FIG. 6 may include coder/decoder (CODEC) 634 (e.g., an audio and/or voice CODEC) coupled to processor 601; speaker 636 and microphone 638 coupled to CODEC 634; and wireless circuits 640 (which may include a modem, RF circuitry, filters, etc.) coupled to wireless antenna 642 and to processor 601.

In some aspects, one or more of processor 601, display controller 626, memory 632, CODEC 634, and wireless circuits 640 may include one or more IC packages prepared according to the examples described in this disclosure.

It should be noted that although FIG. 6 depicts a mobile device 600, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
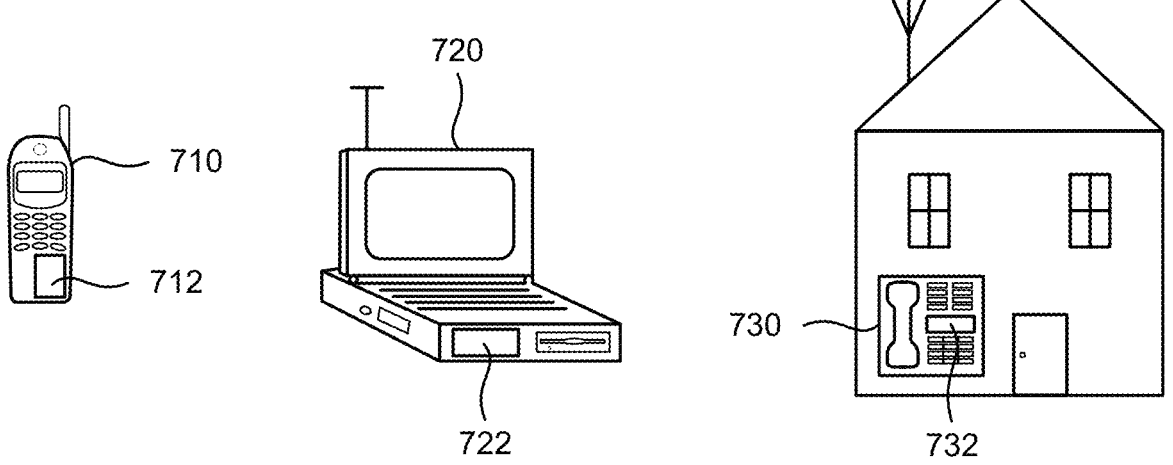
FIG. 7 illustrates various electronic devices that may be integrated with IC packages, according to aspects of the disclosure.

FIG. 7 illustrates various electronic devices 710, 720, and 730 that may be integrated with IC packages 712, 722, and 732, according to aspects of the disclosure. For example, a mobile phone device 710, a laptop computer device 720, and a fixed location terminal device 730 may each be considered generally user equipment (UE) and may include one or more ICs, such as IC packages 712, 722, and 732, and a power supply to provide the supply voltages to power the IC packages. The IC packages 712, 722, and 732 may be, for example, correspond to the IC package described in this disclosure with IC dies and package bumps arranged according to the examples shown in FIGS. 3A-3C.

The devices 710, 720, and 730 illustrated in FIG. 7 are merely non-limiting examples. Other electronic devices may also feature the IC package as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1A-7 may be rearranged and/or combined into a single component, process, feature, or function or incorporated in several components, processes, or functions. Additional elements, components, processes, and/or functions may also be added without departing from the disclosure. In some implementations, FIGS. 1A-7 and the corresponding description may be used to manufacture, create, provide, and/or produce integrated devices. In some implementations, a device may include a die, an integrated device, a die package, an IC, a device package, an IC package, a wafer, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. An integrated circuit (IC) package, comprising: a package substrate having an upper surface, a lower surface, a first side, and a second side perpendicular to the first side, wherein the package substrate includes a metallization structure; an IC die attached to the upper surface of the package substrate; first package bumps on the lower surface of the package substrate, the first package bumps electrically coupled to the metallization structure and electrically coupled to a first power node of the IC die; and second package bumps on the lower surface of the package substrate, the second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged adjacent to one another along the diagonal direction.

Clause 2. The IC package of clause 1, wherein the diagonal direction is at an angle of 45 degrees or 135 degrees relative to the first side.

Clause 3. The IC package of any of clauses 1 to 2, wherein the metallization structure comprises: first conductive lines extending along the diagonal direction and electrically coupled with the first package bumps; and second conductive lines extending along the diagonal direction and electrically coupled with the second package bumps.

Clause 4. The IC package of clause 3, wherein the first conductive lines and the second conductive lines are at a same conductive layer of the metallization structure.

Clause 5. The IC package of any of clauses 1 to 4, wherein the metallization structure comprises: sets of third conductive lines extending along a second direction parallel to the second side of the package substrate and electrically coupled with the first package bumps, respectively; sets of fourth conductive lines extending along a first direction parallel to the first side of the package substrate and electrically coupled with adjacent conductive lines of the sets of third conductive lines, respectively; sets of fifth conductive lines extending along the second direction and electrically coupled with the second package bumps, respectively; and sets of sixth conductive lines extending along the first direction and electrically coupled with adjacent conductive lines of the sets of fifth conductive lines, respectively.

Clause 6. The IC package of clause 5, wherein: the sets of third conductive lines and the sets of fifth conductive lines are at one conductive layer of the metallization structure, and the sets of fourth conductive lines and the sets of sixth conductive lines are at another conductive layer of the metallization structure.

Clause 7. The IC package of any of clauses 1 to 6, wherein the package substrate further comprises: a second metallization structure; and a core layer between the metallization structure and the second metallization structure.

Clause 8. The IC package of any of clauses 1 to 7, wherein the package substrate further comprises: a passive electronic component electrically coupled to at least one of the first package bumps or at least one of the second package bumps via the metallization structure.

Clause 9. The IC package of clause 8, wherein the passive electronic component is: a capacitive component having a first terminal electrically coupled to one of the first package bumps and a second terminal electrically coupled to one of the second package bumps; or an inductive component having a first terminal electrically coupled to one of the first package bumps and a second terminal electrically coupled to the first power node of the IC die.

Clause 10. A method of manufacturing an integrated circuit (IC) package, comprising: forming a package substrate having an upper surface, a lower surface, a first side, and a second side perpendicular to the first side, wherein the package substrate includes a metallization structure; forming package bumps on the lower surface of the package substrate; and attaching an IC die to the upper surface of the package substrate wherein the package bumps comprising: first package bumps electrically coupled to the metallization structure and electrically coupled to a first power node of the IC die; and second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged adjacent to one another along the diagonal direction.

Clause 11. The method of manufacturing the IC package of clause 10, wherein the diagonal direction is at an angle of 45 degrees or 135 degrees relative to the first side.

Clause 12. The method of manufacturing the IC package of any of clauses 10 to 11, wherein the forming the package substrate comprises: forming first conductive lines in the metallization structure extending along the diagonal direction and electrically coupled with the first package bumps; and forming second conductive lines in the metallization structure extending along the diagonal direction and electrically coupled with the second package bumps.

Clause 13. The method of manufacturing the IC package of clause 12, wherein the first conductive lines and the second conductive lines are at a same conductive layer of the metallization structure.

Clause 14. The method of manufacturing the IC package of any of clauses 10 to 13, wherein the forming the package substrate comprises: forming sets of third conductive lines in the metallization structure extending along a second direction parallel to the second side of the package substrate and electrically coupled with the first package bumps, respectively; forming sets of fourth conductive lines in the metallization structure extending along a first direction parallel to the first side of the package substrate and electrically coupled with adjacent conductive lines of the sets of third conductive lines, respectively; forming sets of fifth conductive lines in the metallization structure extending along the second direction and electrically coupled with the second package bumps, respectively; and forming sets of sixth conductive lines in the metallization structure extending along the first direction and electrically coupled with adjacent conductive lines of the sets of fifth conductive lines, respectively.

Clause 15. The method of manufacturing the IC package of clause 14, wherein: the sets of third conductive lines and the sets of fifth conductive lines are at one conductive layer of the metallization structure, and the sets of fourth conductive lines and the sets of sixth conductive lines are at another conductive layer of the metallization structure.

Clause 16. The method of manufacturing the IC package of any of clauses 10 to 15, wherein the forming the package substrate comprises: forming a passive electronic component electrically coupled to at least one of the first package bumps or at least one of the second package bumps via the metallization structure.

Clause 17. The method of manufacturing the IC package of clause 16, wherein the passive electronic component is: a capacitive component having a first terminal electrically coupled to one of the first package bumps and a second terminal electrically coupled to one of the second package bumps; or an inductive component having a first terminal electrically coupled to one of the first package bumps and a second terminal electrically coupled to the first power node of the IC die.

Clause 18. A package substrate having an upper surface, a lower surface, a first side, and a second side perpendicular to the first side, the package substrate comprising: a plurality of die-side bump pads on the upper surface of the package substrate for receiving an integrated circuit (IC) die, the plurality of die-side bump pads comprising: first die-side bump pads corresponding to a first power node of the IC die, and second die-side bump pads corresponding to a second power node of the IC die; a metallization structure; a plurality of package bump pads on the lower surface of the package substrate for receiving package bumps, the plurality of package bump pads comprising: first package bump pads electrically coupled to the metallization structure and electrically coupled to the first die-side bump pads; and second package bump pads for a second supply voltage, the second package bump pads electrically coupled to the metallization structure and electrically coupled to the second die-side bump pads, wherein the package substrate includes a first side and a second side perpendicular to the first side, wherein the first package bump pads are arranged adjacent to one another along a diagonal direction that is diagonal to the package substrate, and wherein the second package bump pads are arranged adjacent to one another along the diagonal direction.

Clause 19. The package substrate of clause 18, wherein the diagonal direction is at an angle of 45 degrees or 135 degrees relative to the first side.

Clause 20. The package substrate of any of clauses 18 to 19, wherein the metallization structure comprises: first conductive lines extending along the diagonal direction and electrically coupled with the first package bump pads; and second conductive lines extending along the diagonal direction and electrically coupled with the second package bump pads.

Clause 21. The package substrate of clause 20, wherein the first conductive lines and the second conductive lines are at a same conductive layer of the metallization structure.

Clause 22. The package substrate of any of clauses 18 to 21, wherein the metallization structure comprises: sets of third conductive lines extending along a second direction parallel to the second side of the package substrate and electrically coupled with the first package bump pads, respectively; sets of fourth conductive lines extending along a first direction parallel to the first side of the package substrate and electrically coupled with adjacent conductive lines of the sets of third conductive lines, respectively; sets of fifth conductive lines extending along the second direction and electrically coupled with the second package bump pads, respectively; and sets of sixth conductive lines extending along the first direction and electrically coupled with adjacent conductive lines of the sets of fifth conductive lines, respectively.

Clause 23. The package substrate of clause 22, wherein: the sets of third conductive lines and the sets of fifth conductive lines are at one conductive layer of the metallization structure, and the sets of fourth conductive lines and the sets of sixth conductive lines are at another conductive layer of the metallization structure.

Clause 24. The package substrate of any of clauses 18 to 23, wherein the package substrate further comprises: a passive electronic component electrically coupled to at least one of the first package bump pads or at least one of the second package bump pads via the metallization structure.

Clause 25. The package substrate of clause 24, wherein the passive electronic component is: a capacitive component having a first terminal electrically coupled to one of the first package bump pads and a second terminal electrically coupled to one of the second package bump pads; or an inductive component having a first terminal electrically coupled to one of the first package bump pads and a second terminal electrically coupled to a die-side bump pad.

Clause 26. An apparatus, comprising: an integrated circuit (IC) package comprising: a package substrate having an upper surface, a lower surface, a first side, and a second side perpendicular to the first side, wherein the package substrate includes a metallization structure; an IC die attached to the upper surface of the package substrate; first package bumps on the lower surface of the package substrate, the first package bumps electrically coupled to the metallization structure and electrically coupled to a first power node of the IC die; and second package bumps on the lower surface of the package substrate, the second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged adjacent to one another along the diagonal direction.

Clause 27. The apparatus of clause 26, wherein the diagonal direction is at an angle of 45 degrees or 135 degrees relative to the first side.

Clause 28. The apparatus of any of clauses 26 to 27, wherein the metallization structure comprises: first conductive lines extending along the diagonal direction and electrically coupled with the first package bumps; and second conductive lines extending along the diagonal direction and electrically coupled with the second package bumps.

Clause 29. The apparatus of any of clauses 26 to 28, wherein the metallization structure comprises: sets of third conductive lines extending along a second direction parallel to the second side of the package substrate and electrically coupled with the first package bumps, respectively; sets of fourth conductive lines extending along a first direction parallel to the first side of the package substrate and electrically coupled with adjacent conductive lines of the sets of third conductive lines, respectively; sets of fifth conductive lines extending along the second direction and electrically coupled with the second package bumps, respectively; and sets of sixth conductive lines extending along the first direction and electrically coupled with adjacent conductive lines of the sets of fifth conductive lines, respectively.

Clause 30. The apparatus of any of clauses 26 to 29, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An integrated circuit (IC) package, comprising:
   a package substrate having an upper surface, a lower surface, a first side, and a second side perpendicular to the first side, wherein the package substrate includes a metallization structure;
   an IC die attached to the upper surface of the package substrate;
first package bumps on the lower surface of the package substrate, the first package bumps electrically coupled to the metallization structure and electrically coupled to a first power node of the IC die; and
   second package bumps on the lower surface of the package substrate, the second package bumps electrically coupled to the metallization structure and electrically coupled to a second power node of the IC die,
   wherein the first package bumps are arranged adjacent to one another along a diagonal direction that is diagonal to the package substrate,
   wherein the second package bumps are arranged adjacent to one another along the diagonal direction, and
   wherein the metallization structure comprises:
   first conductive lines extending along the diagonal direction and electrically coupled with the first package bumps; and
   second conductive lines extending along the diagonal direction and electrically coupled with the second package bumps.

2. The IC package of claim 1, wherein the diagonal direction is at an angle of 45 degrees or 135 degrees relative to the first side.

3. The IC package of claim 1, wherein the first conductive lines and the second conductive lines are at a same conductive layer of the metallization structure.

4. The IC package of claim 1, wherein the package substrate further comprises:
   a second metallization structure; and
   a core layer between the metallization structure and the second metallization structure.

5. The IC package of claim 1, wherein the package substrate further comprises:
   a passive electronic component electrically coupled to at least one of the first package bumps or at least one of the second package bumps via the metallization structure.

6. The IC package of claim 5, wherein the passive electronic component is:
   a capacitive component having a first terminal electrically coupled to one of the first package bumps and a second terminal electrically coupled to one of the second package bumps; or
   an inductive component having a first terminal electrically coupled to one of the first package bumps and a second terminal electrically coupled to the first power node of the IC die.

7. The IC package of claim 1, wherein the package substrate further comprises:
   a plurality of die-side bump pads on the upper surface of the package substrate for receiving the integrated circuit (IC) die, the plurality of die-side bump pads comprising:
   first die-side bump pads corresponding to the first power node of the IC die; and second die-side bump pads corresponding to the second power node of the IC die.

8. An integrated circuit (IC) package, comprising:
   a package substrate having an upper surface, a lower surface, a first side, and a second side perpendicular to the first side, wherein the package substrate includes a metallization structure;
   an IC die attached to the upper surface of the package substrate;
first package bumps on the lower surface of the package substrate, the first package bumps electrically coupled to the metallization structure and electrically coupled to a first power node of the IC die; and
   second package bumps on the lower surface of the package substrate, the second package bumps electrically coupled to the metallization structure and electrically coupled to a second power node of the IC die,
   wherein the first package bumps are arranged adjacent to one another along a diagonal direction that is diagonal to the package substrate,
   wherein the second package bumps are arranged adjacent to one another along the diagonal direction, and
   wherein the metallization structure comprises:
   sets of third conductive lines extending along a second direction parallel to the second side of the package substrate and electrically coupled with the first package bumps, respectively;
sets of fourth conductive lines extending along a first direction parallel to the first side of the package substrate and electrically coupled with adjacent conductive lines of the sets of third conductive lines, respectively;
   sets of fifth conductive lines extending along the second direction and electrically coupled with the second package bumps, respectively; and
   sets of sixth conductive lines extending along the first direction and electrically coupled with adjacent conductive lines of the sets of fifth conductive lines, respectively.

9. The IC package of claim 8, wherein:
   the sets of third conductive lines and the sets of fifth conductive lines are at one conductive layer of the metallization structure, and
   the sets of fourth conductive lines and the sets of sixth conductive lines are at another conductive layer of the metallization structure.

10. A method of manufacturing an integrated circuit (IC) package, comprising:
   forming a package substrate having an upper surface, a lower surface, a first side, and a second side perpendicular to the first side, wherein the package substrate includes a metallization structure;
   forming package bumps on the lower surface of the package substrate; and
attaching an IC die to the upper surface of the package substrate
   wherein the package bumps comprising:
   first package bumps electrically coupled to the metallization structure and electrically coupled to a first power node of the IC die; and
   second package bumps electrically coupled to the metallization structure and electrically coupled to a second power node of the IC die,
   wherein the first package bumps are arranged adjacent to one another along a diagonal direction that is diagonal to the package substrate,
   wherein the second package bumps are arranged adjacent to one another along the diagonal direction, and wherein the forming the package substrate comprises:

forming sets of third conductive lines in the metallization structure extending along a second direction parallel to the second side of the package substrate and electrically coupled with the first package bumps, respectively;

forming sets of fourth conductive lines in the metallization structure extending along a first direction parallel to the first side of the package substrate and electrically coupled with adjacent conductive lines of the sets of third conductive lines, respectively;

forming sets of fifth conductive lines in the metallization structure extending along the second direction and electrically coupled with the second package bumps, respectively; and forming sets of sixth conductive lines in the metallization structure extending along the first direction and electrically coupled with adjacent conductive lines of the sets of fifth conductive lines, respectively.

11. The method of manufacturing the IC package of claim 10, wherein the diagonal direction is at an angle of 45 degrees or 135 degrees relative to the first side.

12. The method of manufacturing the IC package of claim 10, wherein the forming the package substrate comprises:

forming first conductive lines in the metallization structure extending along the diagonal direction and electrically coupled with the first package bumps; and forming second conductive lines in the metallization structure extending along the diagonal direction and electrically coupled with the second package bumps.

13. The method of manufacturing the IC package of claim 12, wherein the first conductive lines and the second conductive lines are at a same conductive layer of the metallization structure.

14. The method of manufacturing the IC package of claim 10, wherein:

the sets of third conductive lines and the sets of fifth conductive lines are at one conductive layer of the metallization structure, and the sets of fourth conductive lines and the sets of sixth conductive lines are at another conductive layer of the metallization structure.

15. The method of manufacturing the IC package of claim 10, wherein the forming the package substrate comprises:

forming a passive electronic component electrically coupled to at least one of the first package bumps or at least one of the second package bumps via the metallization structure.

16. The method of manufacturing the IC package of claim 15, wherein the passive electronic component is:

a capacitive component having a first terminal electrically coupled to one of the first package bumps and a second terminal electrically coupled to one of the second package bumps; or an inductive component having a first terminal electrically coupled to one of the first package bumps and a second terminal electrically coupled to the first power node of the IC die.

17. An apparatus, comprising:

an integrated circuit (IC) package comprising:

a package substrate having an upper surface, a lower surface, a first side, and a second side perpendicular to the first side, wherein the package substrate includes a metallization structure;

an IC die attached to the upper surface of the package substrate;

first package bumps on the lower surface of the package substrate, the first package bumps electrically coupled to the metallization structure and electrically coupled to a first power node of the IC die; and second package bumps on the lower surface of the package substrate, the second package bumps electrically coupled to the metallization structure and electrically coupled to a second power node of the IC die, wherein the first package bumps are arranged adjacent to one another along a diagonal direction that is diagonal to the package substrate, and wherein the second package bumps are arranged to one another along the diagonal direction, wherein the metallization structure comprises:

first conductive lines extending along the diagonal direction and electrically coupled with the first package bumps; and second conductive lines extending along the diagonal direction and electrically coupled with the second package bumps.

18. The apparatus of claim 17, wherein the diagonal direction is at an angle of 45 degrees or 135 degrees relative to the first side.

19. The apparatus of claim 17, wherein the metallization structure comprises:

sets of third conductive lines extending along a second direction parallel to the second side of the package substrate and electrically coupled with the first package bumps, respectively;

sets of fourth conductive lines extending along a first direction parallel to the first side of the package substrate and electrically coupled with adjacent conductive lines of the sets of third conductive lines, respectively;

sets of fifth conductive lines extending along the second direction and electrically coupled with the second package bumps, respectively; and sets of sixth conductive lines extending along the first direction and electrically coupled with adjacent conductive lines of the sets of fifth conductive lines, respectively.

20. The apparatus of claim 17, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

* * * * *